US009177957B1

(12) United States Patent
Lee et al.

(10) Patent No.: US 9,177,957 B1
(45) Date of Patent: Nov. 3, 2015

(54) EMBEDDED PACKAGING DEVICE

(71) Applicant: Delta Electronics, Inc., Taoyuan County (TW)

(72) Inventors: Peng Hsin Lee, Taoyuan County (TW); Hsin Chang Tsai, Taoyuan County (TW); Chia Yen Lee, Taoyuan County (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 14/516,169

(22) Filed: Oct. 16, 2014

(51) Int. Cl.
*H01L 27/092* (2006.01)

(52) U.S. Cl.
CPC .................................. *H01L 27/0922* (2013.01)

(58) Field of Classification Search
CPC ....................................................... H01L 21/50
USPC ........................................................... 361/697
See application file for complete search history.

(56) References Cited

U.S. PATENT DOCUMENTS

2010/0019368 A1*  1/2010  Shin ............................. 257/686
2012/0161331 A1*  6/2012  Gonzalez et al. ............. 257/774

* cited by examiner

*Primary Examiner* — Tuan Nguyen
(74) *Attorney, Agent, or Firm* — Muncy, Geissler, Olds & Lowe, P.C.

(57) ABSTRACT

An embedded packaging device is provided, including a leadframe, a first semiconductor component, a second semiconductor component, a passive component, and a first dielectric layer. The leadframe forms a counterbore. The first semiconductor component is disposed on the leadframe. The second semiconductor component is disposed on the leadframe and electrically connected with the first semiconductor component through the leadframe. The passive component is disposed on the leadframe and has a different thickness from the first semiconductor component, wherein the passive component or the first semiconductor component is disposed in the counterbore of the leadframe, such that a top surface of the passive component has the same height as that of the first semiconductor component. The first dielectric layer is formed on the leadframe and covers the first semiconductor component, the second semiconductor component, and the passive component.

19 Claims, 8 Drawing Sheets

EMBEDDED PACKAGING DEVICE

BACKGROUND OF THE INVENTION

1. Field of the Invention

The present application relates to an embedded packaging device, and more particularly to an embedded packaging device including at least two electronic components, each with a different thickness.

2. Description of the Related Art

Embedded electronic packaging technologies have been significant growth due to their ability to reduce the size and cost of devices and enable higher levels of integration for various electronic products.

However, there is still a challenge in packaging a plurality of electronic components with different thickness. For example, a dielectric layer with a larger thickness is required for covering and insulating the electronic components, such that the miniaturization of an embedded packaging device is adversely affected. Additionally, the internal wiring layer formation also becomes more complicated because of the different thickness of the electronic components. Furthermore, the traditional embedded packaging device usually has poor heat dissipation ability.

BRIEF SUMMARY OF THE INVENTION

In view of the aforementioned problems, an embodiment of the invention provides an embedded packaging device, comprising a leadframe, a first semiconductor component, a second semiconductor component, a passive component, a first dielectric layer, a plurality of first conductive vias, and a first conductive film. The first semiconductor component is disposed on the leadframe. The second semiconductor component is disposed on the leadframe and electrically connected with the first semiconductor component. The passive component is disposed on the leadframe and electrically connected with the first semiconductor component and the second semiconductor component. The first dielectric layer is formed on the leadframe and covers the first semiconductor component, the second semiconductor component, and the passive component. The plurality of first conductive vias are formed in the first dielectric layer.

The first conductive film is formed on the first dielectric layer and electrically connected with at least one of the second semiconductor component and the leadframe through the plurality of first conductive vias. At least one of the first semiconductor component and the second semiconductor component is flip-chip mounted on the leadframe.

Another embodiment of the invention provides an embedded packaging device, comprising a leadframe, a first semiconductor component, a second semiconductor component, a passive component, and a first dielectric layer. The leadframe forms a counterbore. The first semiconductor component is disposed on the leadframe. The second semiconductor component is disposed on the leadframe, electrically connected with the first semiconductor component through the leadframe, and having a different thickness from the first semiconductor component. The first semiconductor component or the second semiconductor component is disposed in the counterbore of the leadframe, such that a top surface of the second semiconductor component has the same height as that of the first semiconductor component. The passive component is disposed on the leadframe. The first dielectric layer is formed on the leadframe and covers the first semiconductor component, the second semiconductor component, and the passive component.

Another embodiment of the invention provides an embedded packaging device, comprising a leadframe, an HV switch, a LV switch, a passive component, a first dielectric layer, a plurality of first conductive vias, and a first conductive film. The leadframe includes a first part, a second part, a third part, and a fourth part. The HV switch is disposed on the leadframe and has a first drain pad electrically connected with the first part of the leadframe, a first gate pad electrically connected with the second part of the leadframe, and a first source pad electrically connected with the third part of the leadframe. The LV switch is disposed on the leadframe and has a second drain pad electrically connected with the third part of the leadframe, a second gate pad electrically connected with the fourth part of the leadframe, and a second source pad electrically connected with the second part of the leadframe. The passive component is disposed on the leadframe and has a first terminal electrically connected with the second part of the leadframe and a second terminal electrically connected with the third part of the leadframe. The first dielectric layer is formed on the leadframe and covers the HV switch, the LV switch, and the passive component. The plurality of first conductive vias are formed in the first dielectric layer. The first conductive film is formed on the first dielectric layer and electrically connected with the LV switch and the leadframe through the plurality of first conductive vias.

BRIEF DESCRIPTION OF THE DRAWINGS

The invention can be more fully understood by reading the subsequent detailed description and examples with, references made to the accompanying drawings, wherein.

DETAILED DESCRIPTION OF THE INVENTION

Figure 1:
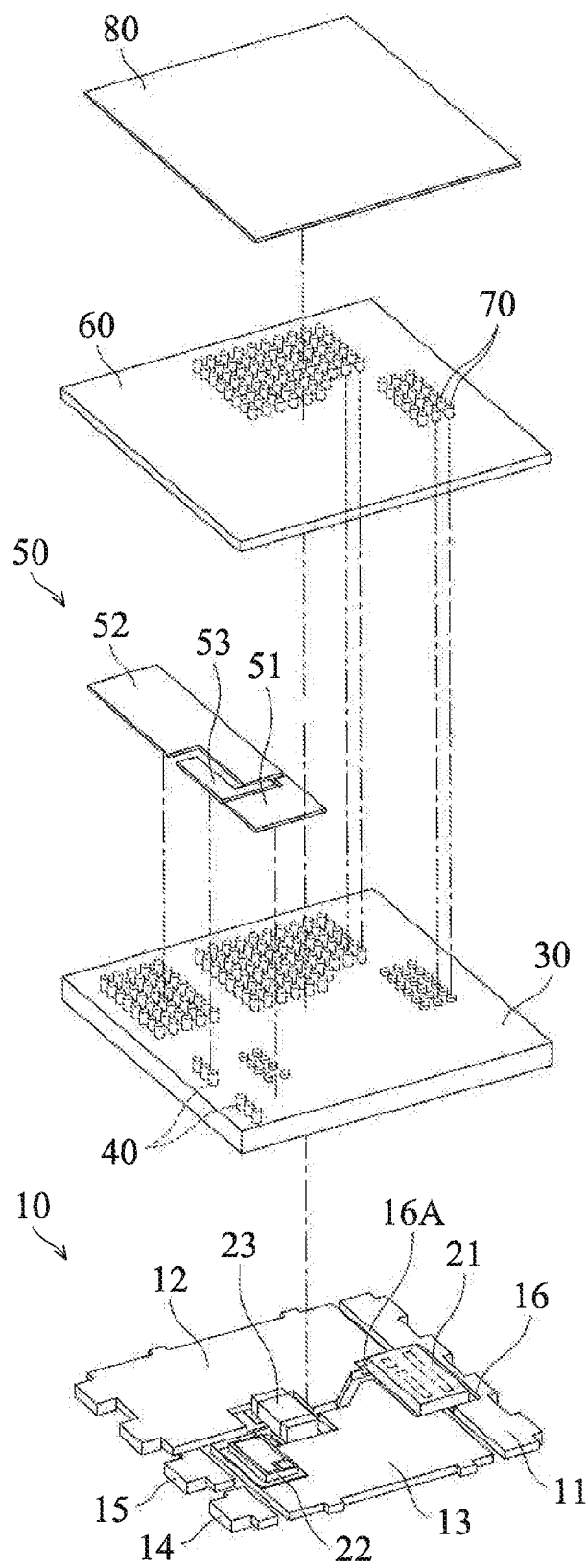
FIG. 1 is an exploded view of an embedded packaging device according to an embodiment of the invention.

Referring to FIG. 1, an embedded packaging device 1 according to an embodiment of the invention primarily includes a leadframe 10, a first semiconductor component 21, a second semiconductor component 22, a passive component 23, a first dielectric layer 30, a plurality of first conductive vias 40, a first conductive film 50, a second dielectric layer 60, a plurality of second conductive vias 70, and a second conductive film 80.

In particular, the embedded packaging device 1 of this embodiment is applied to a power related product, such as a transformer or power supply. Furthermore, the second semiconductor component 22 has a different thickness from that of the first semiconductor component 21 and the passive component 23. In this embodiment, the first semiconductor component 21 and the passive component 23 have a similar thickness, and the second semiconductor component 22 has a smaller thickness relative to the first semiconductor component 21 and the passive component 23 (FIG. 1).

Figure 2:
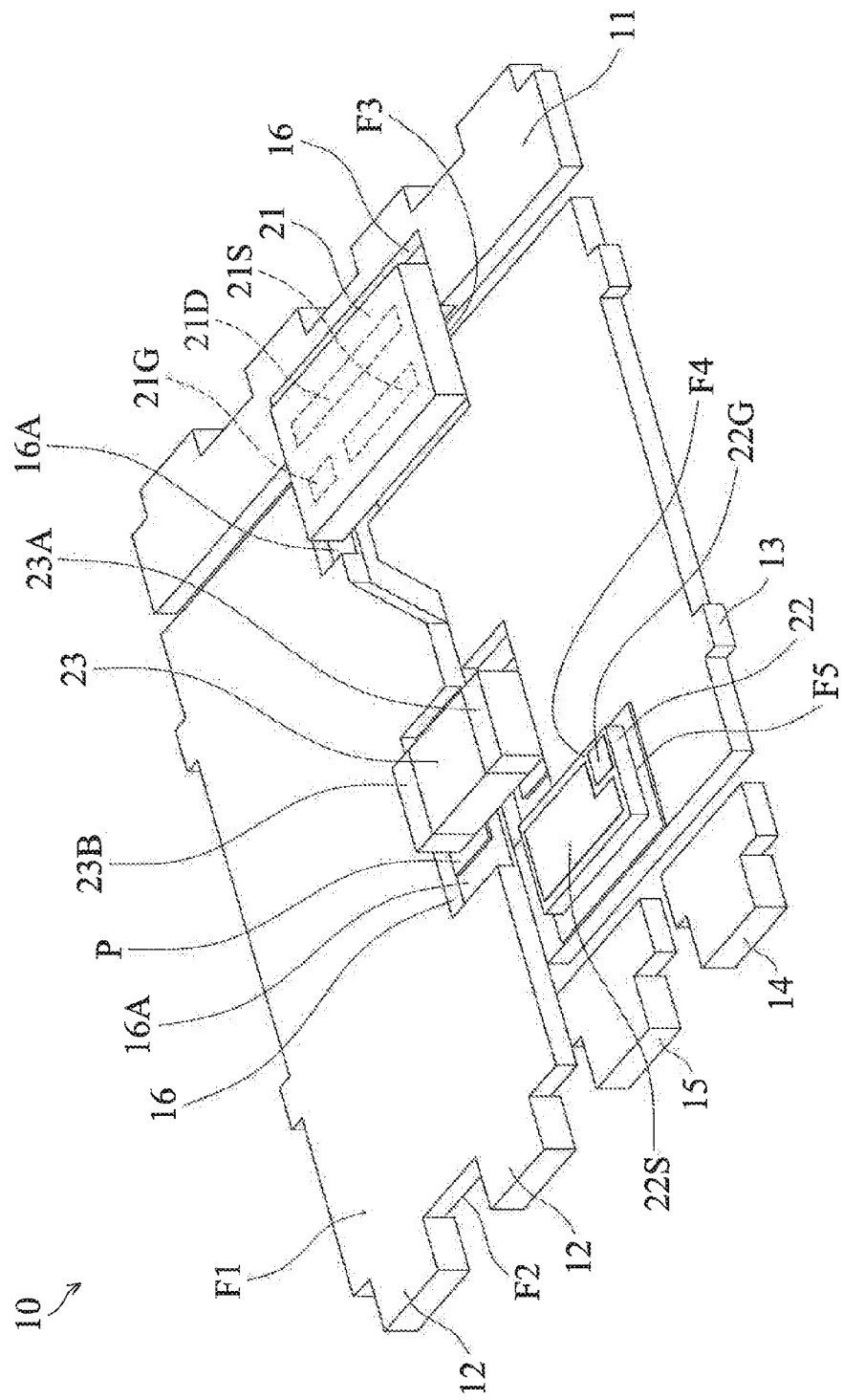
FIG. 2 is an enlarged view of the leadframe, the first semiconductor component, the second semiconductor component, and the passive component in FIG. 1

Referring to FIG. 1 and FIG. 2, the leadframe 10 includes several patterned and separated parts. In this embodiment, the leadframe 10 is made of metal and includes a first part 11, a second part 12, a third part 13, a fourth part 14, and a fifth part 15. Note that the leadframe 10 forms two counterbores 16, wherein each of the counterbores 16 has a bottom surface 16A lower than an upper surface F1 of the leadframe 10.

The second semiconductor components 22 is disposed on the upper surface F1 of the leadframe 10, and the first semiconductor component 21 and the passive component 23 are disposed in the counterbores 16 of the leadframe 10. Thus, a top surface of the second semiconductor component 22 has a height that is the same or similar as that of the first semiconductor component 21 and the passive component 23.

Moreover, the first semiconductor component 21, the second semiconductor component 22, and the passive component 23 are mounted on the leadframe 10 by an interface material P (FIG. 2). Specifically, the interface material P may comprise metal alloy, solder paste, silver adhesive, or other conductive adhesive. Accordingly, the first semiconductor component 21, the second semiconductor component 22, and the passive component 23 can be electrically connected with each other through the leadframe 10.

It should be noted that the first semiconductor component 21 of this embodiment, such as a High-Voltage (HV) switch, is a lateral-type component. As shown in FIG. 1 and FIG. 2, the HV switch 21 has a lower surface F3 with a first source pad 21S, a first drain pad 21D, and a first gate pad 21G disposed thereon. The first drain pad 21D is electrically connected with the first part 11 of the leadframe 10, the first gate pad 21G is electrically connected with the second part 12 of the leadframe 10, and the first source pad 21S is electrically connected with the third part 13 of the leadframe 10. That is, the first semiconductor component 21 is mounted on the leadframe 10 by a flip-chip manner.

Furthermore, the HV switch 21 includes a plurality of HV transistors formed on a substrate and connected in parallel (not shown), wherein each of the HV transistors, such as a lateral-type Depletion mode (D-mode) transistor, has a first source electrode electrically connected with the first source pad 21S, a first drain electrode electrically connected with the first drain pad 21D, and a first gate electrode electrically connected with the first gate pad 21G. In this embodiment, each of the HV transistors is a wide bandgap transistor comprising a SiC transistor or a nitride-based transistor, such as a High Electron Mobility Transistor (HEMT) comprising Gallium Nitride (GaN).

It should be also noted that the second semiconductor component 22 of this embodiment, such as a Low-Voltage (LV) switch, is a vertical-type component. As shown in FIG. 1 and FIG. 2, the LV switch 22 has an upper surface F4 (first surface) and a lower surface F5 (second surface) opposite to the upper surface F4, adjacent to the leadframe 10. Moreover, the LV switch 22 has a second source pad 22S, a second drain pad, and a second gate pad 22G, wherein the second drain pad is disposed on the lower surface F5 of the LV switch 22 and electrically connected with the third part 13 of the leadframe 10, and the second source pad 22S and the second gate pad 22G are disposed on the upper surface F4 of the LV switch 22. Accordingly, the second drain pad of the LV switch 22 is electrically connected with the first source pad 21S of the HV switch 21 through the third part 13 of the leadframe 10.

Furthermore, the LV switch 22 includes a plurality of LV transistors connected in parallel (not shown), wherein each of the LV transistors, such as a vertical-type Enhancement mode (E-mode) transistor, has a second source electrode electrically connected with the second source pad 22S, a second drain electrode electrically connected with the second drain pad, and a second gate electrode electrically connected with the second gate pad 22G. In this embodiment, each of the LV transistors is a silicon-based transistor.

In some embodiments, the first semiconductor component 21 may also be a vertical-type component, and the second semiconductor component 22 may also be a lateral-type component and mounted on the leadframe 10 by a flip chip manner. Alternatively, both the first semiconductor component 21 and the second semiconductor component 22 are lateral-type components and flip chip mounted on the leadframe 10. Furthermore, the second semiconductor component (LV switch) 22 may also be a III-V compound semiconductor, or both the first semiconductor component (HV switch) 21 and the second semiconductor component (LV switch) 22 are III-V compound semiconductors.

As shown in FIG. 1 and FIG. 2, the passive component 23 has a first terminal 23A and a second terminal 23B, wherein the first terminal 23A is electrically connected with the third part 13 of the leadframe 10, and the second terminal 23B is electrically connected with the second part 12 of the leadframe 10. In this embodiment, the passive component 23 is a capacitor.

It should be realized that the embedded packaging device 1 of the invention may have other applications, and the first semiconductor component 21, the second semiconductor component 22, and the passive component 23 are not restricted. In some embodiments, the first and second semiconductor components 21 and 22 may comprise other active components, and the passive component 23 may comprise a resistor or inductor. Additionally, the second semiconductor component 22 may also have a larger thickness relative to the first semiconductor component 21 and the passive component, and the second semiconductor component 22 can be received in a counterbore 16 in some embodiments.

Figure 3:
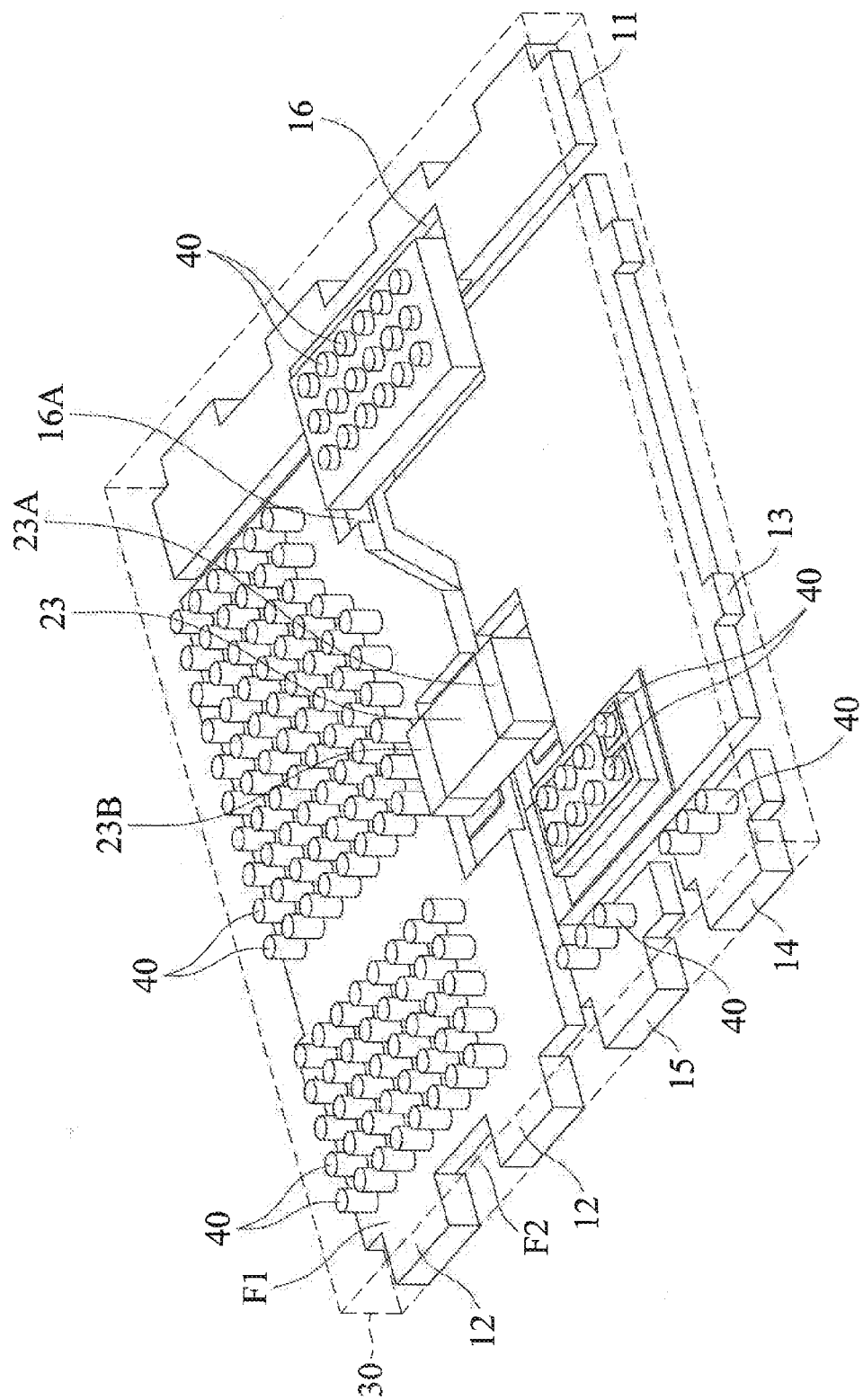
FIG. 3 is a schematic view showing the first dielectric layer and the plurality of first conductive vias in FIG. 1 formed on the leadframe.

Referring to FIGS. 1-3, the first dielectric layer 30 is formed on the leadframe 10 and covers the first semiconductor component 21, the second semiconductor component 22, and the passive component 23. In this embodiment, the first dielectric layer 30 comprises Ajinomoto Build-up Film (ABF) or Epoxy Molding Compound (EMC). Thus, the first dielectric layer 30 can electrically isolate the first semiconductor component 21, the second semiconductor component 22, and the passive component 23.

With the design of counterbores 16 (FIG. 2), the top surface of the second semiconductor component 22 has a height that is the same or similar as that of the first semiconductor component 21 and the passive component 23, such that the first dielectric layer 30 is not required to have a larger thickness for covering the first semiconductor component 21, the second semiconductor component 22, and the passive component 23. Consequently, the first semiconductor component 21, the second semiconductor component 22, and the passive component 23 can be easily integrated into the embedded packaging device 1 and the miniaturization of the embedded packaging device 1 can be achieved.

The plurality of first conductive vias 40 are formed in the first dielectric layer 30 and electrically connected with the first semiconductor component 21, the second semiconductor component 22, and several parts of the leadframe 10. As shown in FIG. 3, some of the first conductive vias 40 are electrically connected with the substrate of the first semiconductor component 21, some of the first conductive vias 40 are electrically connected with the second part 12 of the leadframe 10, some of the first conductive vias 40 are electrically connected with the second gate pad 22G and the second source pad 22S of the second semiconductor component 22, some of the first conductive vias 40 are electrically connected with the fourth part 14 of the leadframe 10, and some of the first conductive vias 40 are electrically connected with the fifth part 15 of the leadframe 10. In this embodiment, the first conductive vias 40 comprise metal, such as copper.

As the top surfaces of the first semiconductor component 21, the second semiconductor component 22, and the passive component 23 have the same or similar height, the first conductive vias 40 on the first and second semiconductor component 21 and 22 can be formed by a single process. Thus, the internal wiring layer formation is simplified.

In this embodiment, the first conductive vias 40 replace the traditional internal wiring layers, such as Re-Distribution Layers (RDLs). Compared with the traditional RDLs, the first conductive vias 40 have larger cross-sectional area, thus loading greater electric current and reducing the parasitic effect.

Figure 4:
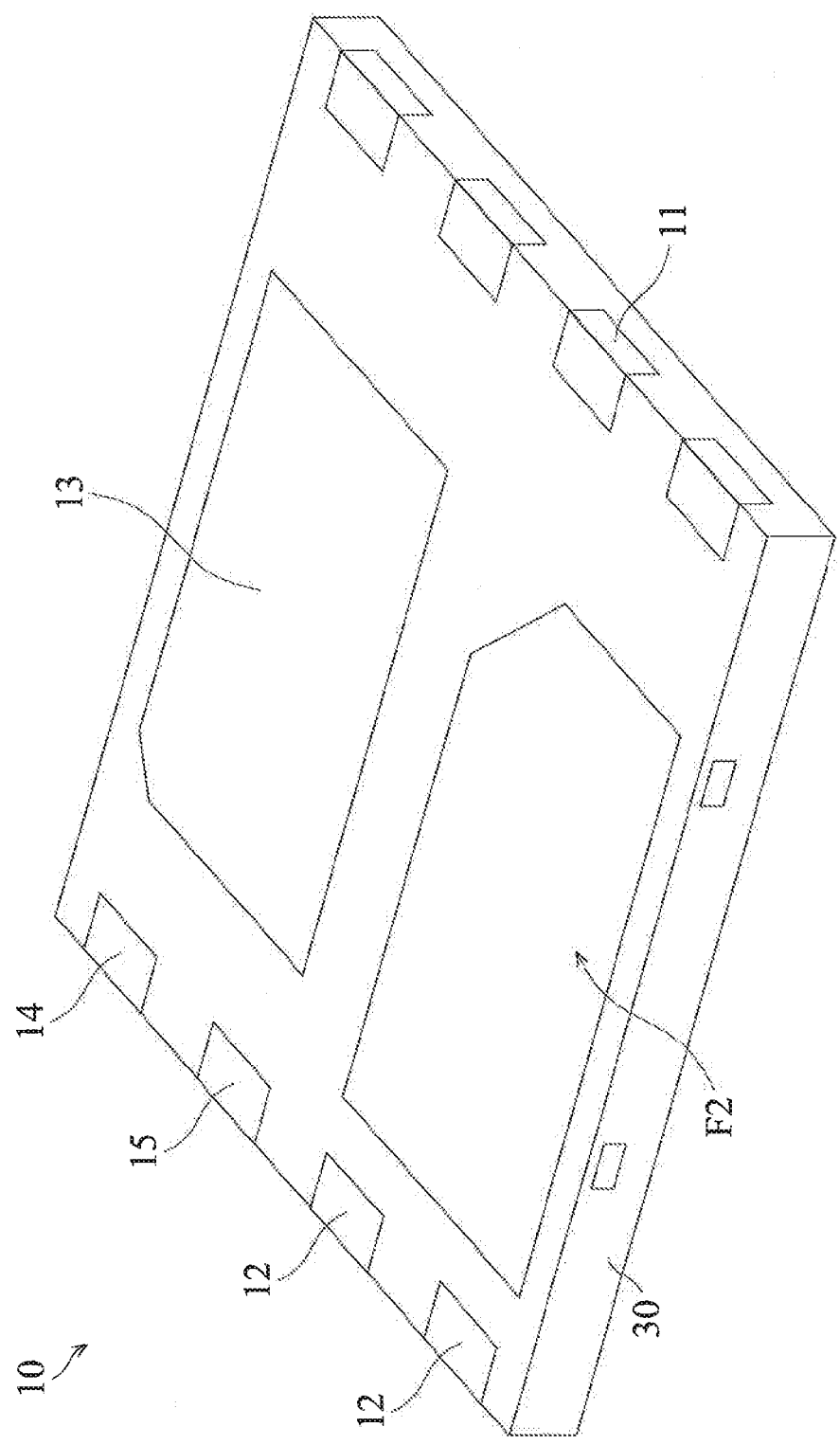
FIG. 4 is a schematic view of FIG. 3 from another view angle.

Referring to FIG. 4, a lower surface F2 of the leadframe 10 is not completely covered by the first dielectric layer 30, such that an external electrical connection can be established through the lower surface F2, and the heat generated from the first semiconductor component 21, the second semiconductor component 22, and the passive component 23 can be effectively dissipated through the lower surface F2 of the leadframe 10.

Referring to FIGS. 1-3 and FIG. 5, the first conductive film 50 is formed on the first dielectric layer 30 and includes a first part 51, a second part 52, and third part 53. In this embodiment, the first conductive film 50 comprises metal, such as copper.

Moreover, the second gate pad 22G of the semiconductor component 22 is electrically connected with the fourth part 14 of the leadframe 10 through the first part 51 of the first conductive film 50, since at least one of the first conductive vias 40 is electrically connected between the first part 51 and the second gate pad 22G, and at least one of the first conductive vias 40 is electrically connected between the first part 51 and the fourth part 14. The second source pad 22S of the second semiconductor component 22 is electrically connected with the second part 12 of the leadframe 10 through the second part 52 of the first conductive film 50, since at least one of the first conductive vias 40 is electrically connected between the second part 52 and the second source pad 22S, and at least one of the first conductive vias 40 is electrically connected between the second part 52 and the second part 12. As the first gate pad 21G of the first semiconductor component 21 is electrically with the second part 12 of the leadframe 10, the second source pad 22S of the second semiconductor component 22 also can be electrically connected with the first gate pad 21G of the first semiconductor component 21. Moreover, the second source pad 22S of the second semiconductor component 22 is also electrically connected with the fifth part 15 of the leadframe 10 through the third part 53 of the first conductive film 50, since at least one of the first conductive vias 40 is electrically connected between the third part 53 and the second source pad 22S, and at least one of the first conductive vias 40 is electrically connected between the third part 53 and the fifth part 15.

As shown in FIGS. 1-3 and FIG. 5, the first terminal 23A of the passive component 23 is electrically connected with the second drain pad of the second semiconductor component 22 and the first source pad 21S of the first semiconductor component 21 through the third part 13 of the leadframe 10, and the second terminal 23B of the passive component 23 is electrically connected with the second source pad 22S of the second semiconductor component 22 and the first gate pad 21G of the first semiconductor component 21 through the second part 12 of the leadframe 10 and the second part 52 of the first conductive film 52.

Figure 5:
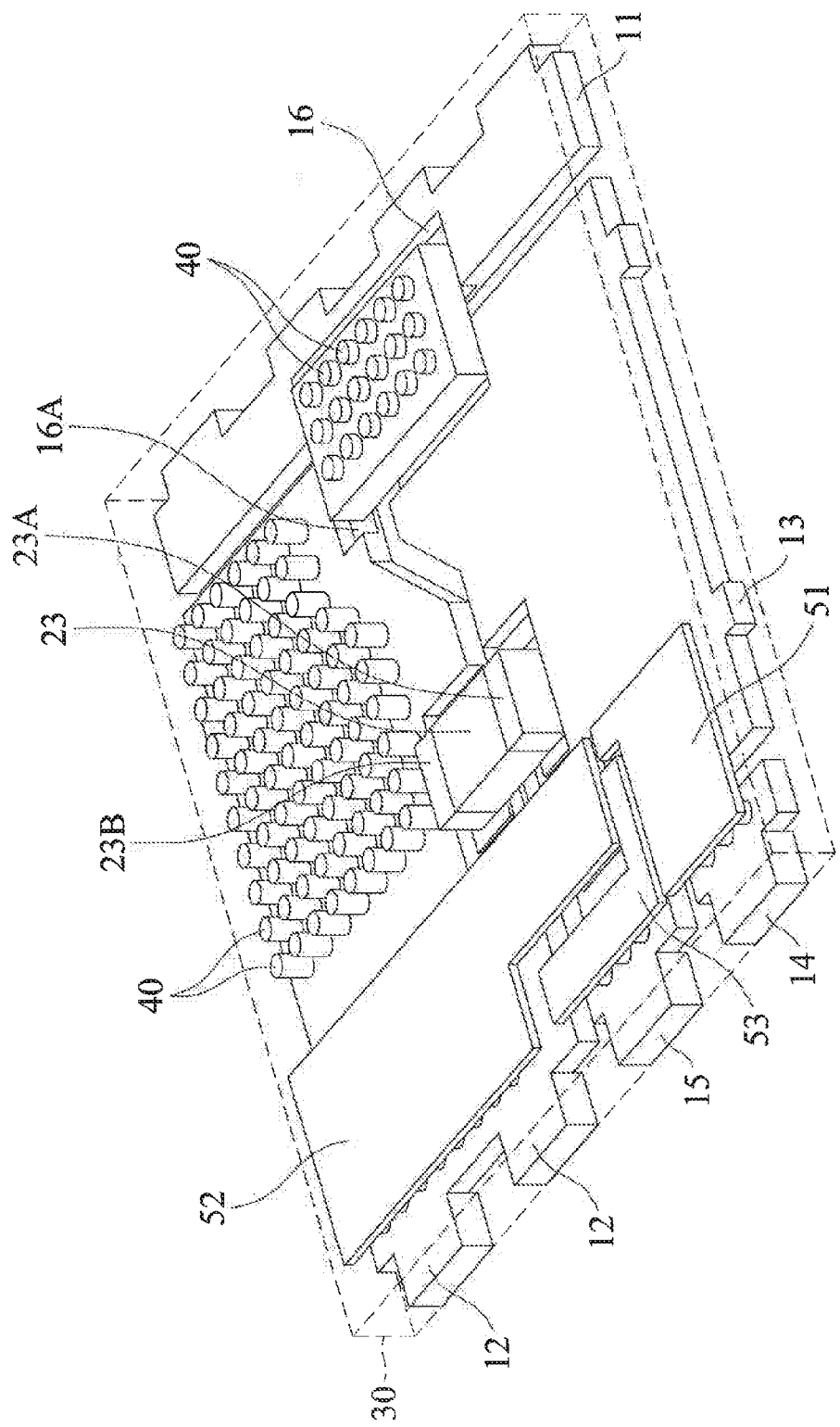
FIG. 5 is a schematic view showing the first conductive film in FIG. 1 formed on the first dielectric layer.
Figure 6:
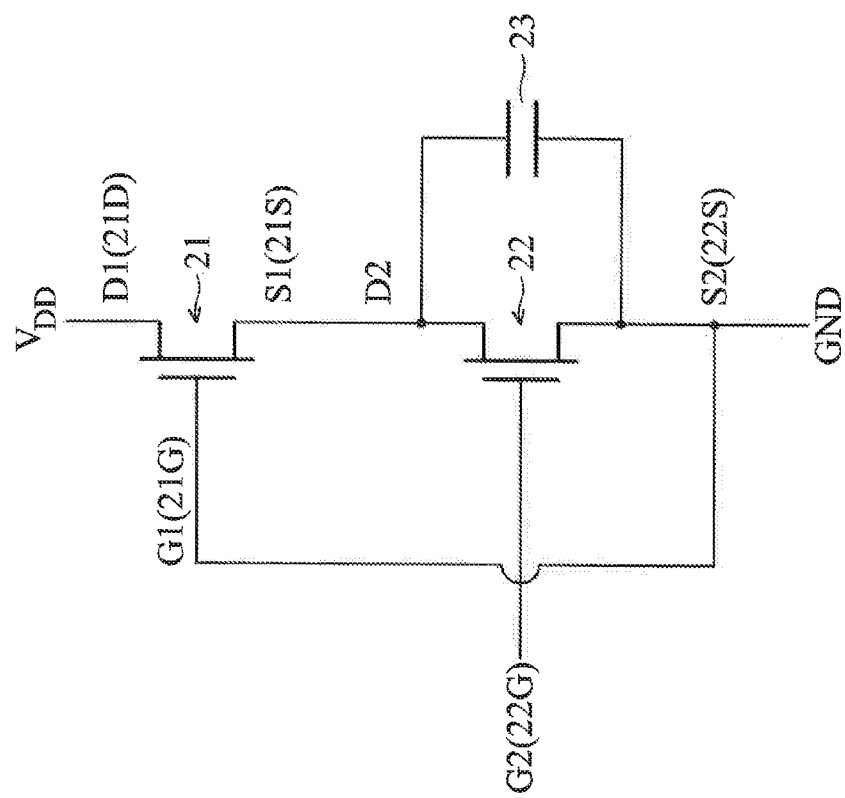
FIG. 6 is a circuit diagram of a cascode switch circuit including the first semiconductor element, the second semiconductor element, and the passive component.

Referring to FIG. 6, with the aforesaid structural features, a cascode switch circuit is achieved. The cascode switch circuit primarily includes the first semiconductor component 21 (HV switch), the second semiconductor component 22 (LV switch), and the passive component 23. In this embodiment, a voltage power VDD is loaded into a drain terminal D1 (the first drain pad 21D) of the HV switch 21 through the first part 11 of the leadframe 10 (FIG. 5), a source terminal S1 (the first source pad 21S) of the HV switch 21 is electrically connected with a drain terminal D2 (the second drain pad 22D) of the LV switch 22 through the third part 13 of the leadframe 10, a gate terminal G1 (the first gate pad 21G) of the HV switch 21 and a source terminal S2 (the second source pad 22S) of the LV switch 22 are electrically grounded (GND) through the second part 12 of the leadframe 10 (FIG. 5), and a switch signal is supplied to a gate terminal G2 (the second gate pad 22G) of the LV switch 22 through the fourth part 14 of the leadframe 10 (FIG. 5). Compared to a single switch circuit, the cascode switch circuit is favorable to supply higher voltage and switch faster.

Moreover, the second source pad 22S of the second semiconductor component 22 of this embodiment is also electrically connected with the fifth part 15 of leadframe 10 through the third part 53 of the first conductive film 50 (FIG. 5). The fifth part 15 of the leadframe 10 serves as a Kelvin source and provides an independent path for the control signal through the gate terminal G2 of the LV switch 22. Thus, the parasitic effect of the cascode switch circuit can also be reduced.

Figure 7:
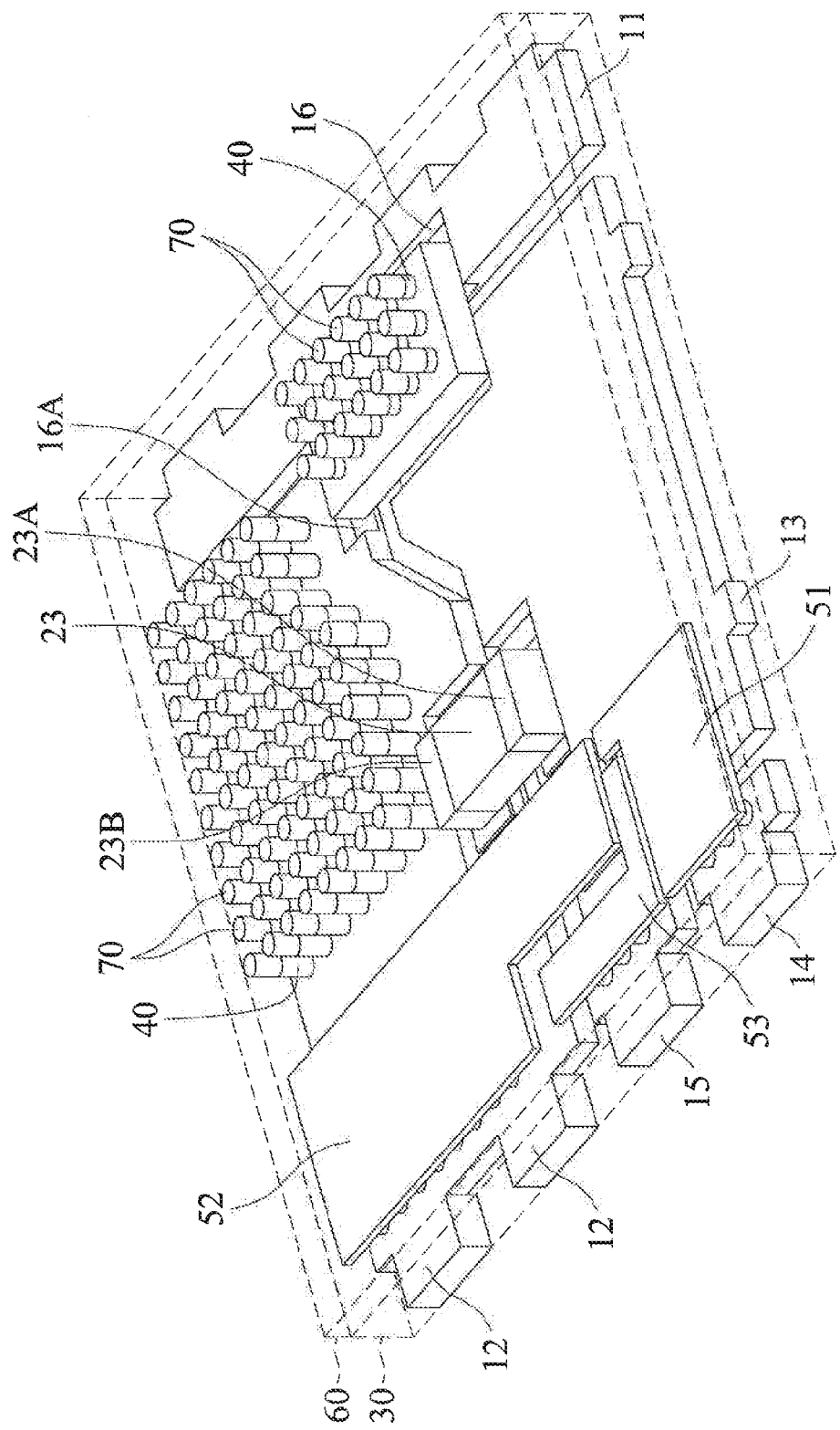
FIG. 7 is a schematic view showing the second dielectric layer and the plurality of second conductive vias in FIG. 1 formed on the first dielectric layer and the first conductive film.

Referring to FIG. 5 and FIG. 7, the second dielectric layer 60 is formed on the first dielectric layer 30 and covers the first conductive film 50. In this embodiment, the second dielectric layer 60 has the same material as that of the first dielectric layer 30. Moreover, the plurality of second conductive vias 70 are formed in the second dielectric layer 60 and electrically connected with a part of the first conductive vias 40. Specifically, some of the second conductive vias 70 are electrically connected with the first conductive vias 40 electrically with the substrate of the first semiconductor component 21, and some of the second conductive vias 70 are electrically connected with the first conductive vias 40 electrically connected with the second part 12 of the leadframe. In this embodiment, the second conductive vias 70 also have the same material as that of the first conductive vias 40. However, in some embodiments, the second dielectric layer 60 may have a different material from the first dielectric layer 30, and/or the second conductive vias 70 may have different material from the first conductive vias 40.

Figure 8:
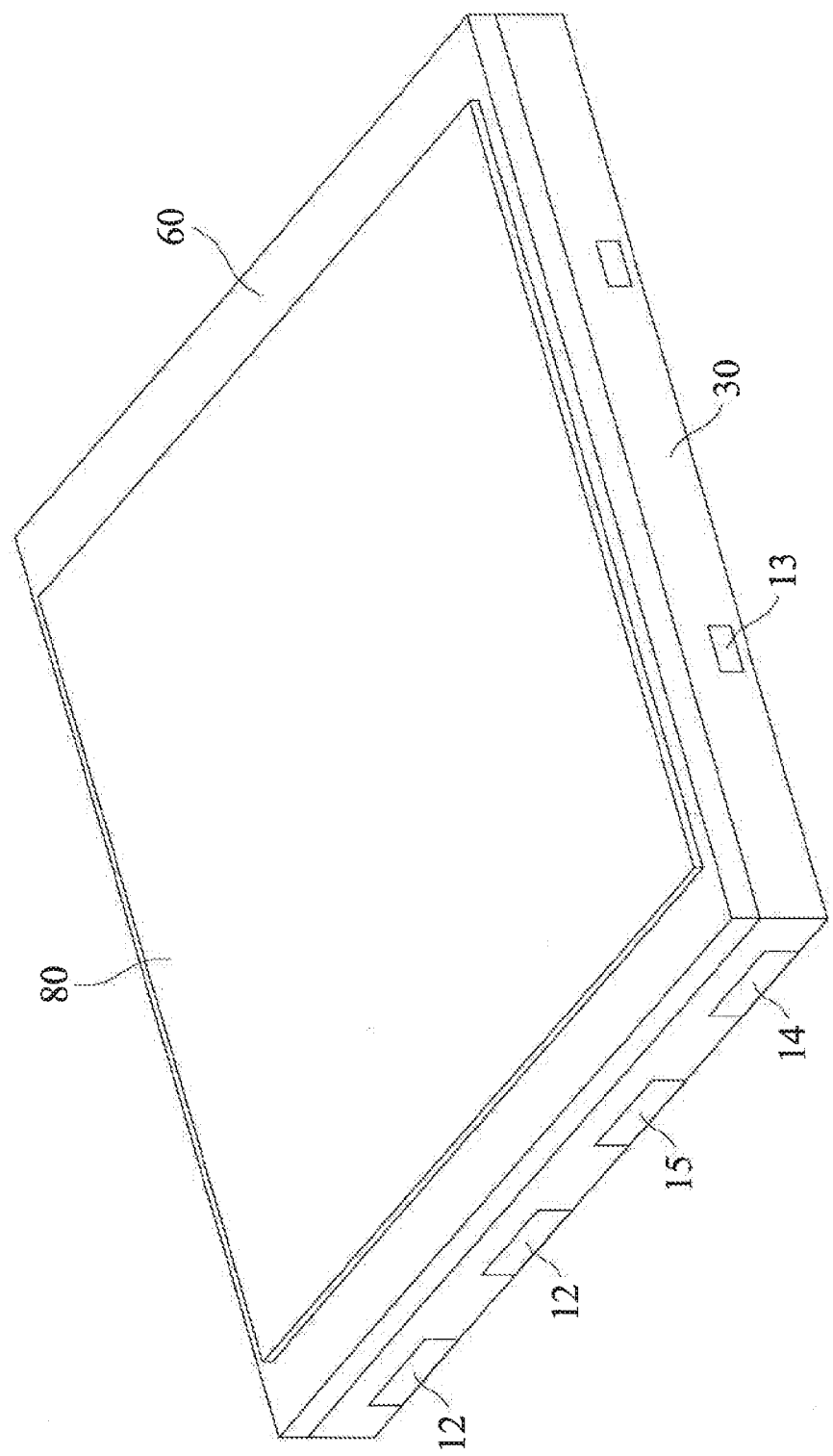
FIG. 8 is a schematic view of the embedded packaging device in FIG. 1 after assembly.

Referring to FIG. 5, FIG. 7, and FIG. 8, the second conductive film 80 is formed on the second dielectric layer 60 and substantially covers the second dielectric layer 60. Moreover, the second conductive film 80 is electrically connected with the substrate of the first semiconductor component 21 and the second part 12 of the leadframe 10 through the first conductive vias 40 and the second conductive vias 70 electrically connected between the second conductive film 80 and the first semiconductor component 21, and between the second conductive film 80 and the second part 12 of the leadframe 10. Accordingly, the second conductive film 80 can facilitate faster heat dissipation, lower parasitic capacitance, and better electromagnetic wave shielding of the embedded packaging device 1.

In some embodiments, the second dielectric layer 60, the plurality of second conductive vias 70, and the second conductive film 80 can be omitted, and the plurality of the first conductive vias 40 corresponding to the second conductive vias 70 can be omitted accordingly. In addition, the first conductive film 51 formed on the first dielectric layer 30 can be electrically connected with the second semiconductor component 22 or the second part 12 of the leadframe 10 in some embodiments. In some embodiments, the first conductive film 51 and the plurality of the first conductive vias 40 can also be omitted, and the first semiconductor component 21, the second semiconductor component 22, and the passive component 23 are electrically connected with each other through the leadframe 10. In some embodiments, the embedded packaging device 1 further includes a third semiconductor component disposed on the leadframe 10 and covered by the first dielectric layer 30. The third semiconductor component is electrically connected with the first semiconductor component 21 or the second semiconductor component 22 through an internal or external electric connection of the embedded packaging device 1. In one embodiment, the third component is a driving IC disposed on the leadframe 10, and the driving IC is electrically connected with the second gate pad 22G of the second semiconductor component 22 (LV switch).

Next, the fabrication method of the embedded packaging device 1 according to an embodiment of the invention is described below. Referring to FIGS. 1-8 in sequence (except for FIG. 6).

Referring to FIG. 1 and FIG. 2, a leadframe 10 made of metal is provided firstly. The leadframe 10 has an upper surface F1 and a lower surface F2 opposite to each other, and includes a first part 11, a second part 12, a third part 13, a fourth part 14, and a fifth part 15. Moreover, the leadframe 10 forms two counterbores 16 on the upper surface F1 and traversing the second part 12 and the third part 13. In this embodiment, the leadframe 10 is formed by metal stamping.

Then, a first semiconductor component 21, a second semiconductor component 22, and a passive component 23 are provided and mounted on the leadframe 10 by an interface material P, such as metal alloy, solder paste, silver adhesive, or other conductive adhesive. Specifically, the second semiconductor component 22 is disposed on the upper surface F1 of the leadframe 10, and the first semiconductor component 21 and the passive component 23 are received in the counterbores 16 of the leadframe 10.

As shown in FIG. 1 and FIG. 2, the first semiconductor component 21 is a lateral-type HV switch having a first source pad 21S, a first drain pad 21D, and a first gate pad 21G. The first drain pad 21D is electrically connected with the first part 11 of the leadframe 10, the first gate pad 21G is electrically connected with the second part 12 of the leadframe 10, and the first source pad 21S is electrically connected with the third part 13 of the leadframe 10. The second semiconductor component 22 is a vertical-type LV switch having a second source pad 22S, a second drain pad, and a second gate pad 22G. The second drain pad is disposed on a lower surface F5 of the second semiconductor component 22 and electrically connected with the third part 13 of the leadframe 10, and the second source pad 22S and the second gate pad 22G are disposed on a upper surface F4 of the second semiconductor component 22. The passive component 23 is a capacitor having a first terminal 23A and a second terminal 23B, wherein the first terminal 23A is electrically connected with the third part 13 of the leadframe 10, and the second terminal 23B is electrically connected with the second part 12 of the leadframe 10.

The internal structure and specific material of the first semiconductor component 21, the second semiconductor component 22, and the passive component 23 have been introduced in the aforementioned embodiment and thus are not described again.

Referring to FIG. 3, a first dielectric layer 30 is provided. The first dielectric layer 30 is formed on the leadframe 10 and covers the first semiconductor component 21, the second semiconductor component 22, and the passive component 23. In this embodiment, the first dielectric layer 30 comprises Ajinomoto Build-up Film (ABF) or Epoxy Molding Compound (EMC).

Then, a plurality of holes are formed in the first dielectric layer 30 by laser drilling, and a plurality of first conductive vias 40 are correspondingly formed in the plurality of holes by copper plating. As shown in FIG. 3, some of the first conductive vias 40 are electrically connected with the substrate of the first semiconductor component 21, some of the first conductive vias 40 are electrically connected with the second part 12 of the leadframe 10, some of the first conductive vias 40 are electrically connected with the second gate pad 22G and the second source pad 22S of the second semiconductor component 22, some of the first conductive vias 40 are electrically connected with the fourth part 14 of the leadframe 10, and some of the first conductive vias 40 are electrically connected with the fifth part 15 of the leadframe 10.

Referring to FIG. 4, after the first dielectric layer 30 formed on the leadframe 10, the lower surface F2 of the leadframe 10 is partially exposed (at least the first part 11, the second part 12, the third part 13, the fourth part 14, and the fifth part 15 have some portions to be exposed).

Referring to FIG. 5, a first conductive film 50 is provided and formed on the first dielectric layer 30 by copper plating. In this embodiment, the first conductive film 50 includes a first part 51, a second part 52, and a third part 53.

As shown in FIG. 3 and FIG. 5, the first part 51 of the first conductive film 50 is electrically connected with at least one of the first conductive vias 40 on the second gate pad 22G of the second semiconductor component 22 and electrically connected with at least one of the first conductive vias 40 on the fourth part 14 of the leadframe 10. The second part 52 of the first conductive film 50 is electrically connected with at least one of the first conductive vias 40 on the second source pad 22S of the second semiconductor component 22 and electrically connected with at least one of the first conductive vias 40 on the second part 12 of the leadframe 10. The third part 53 of the first conductive film 50 is electrically connected with at least one of the first conductive vias 40 on the second source pad 22S of the second semiconductor component 22 and electrically connected with at least one of the first conductive vias 40 on the fifth part 15 of the leadframe 10.

Referring to FIG. 7, a second dielectric layer 60 is provided. The second dielectric layer 60 is formed on the first dielectric layer 30 and covers the first conductive film 50. In this embodiment, the second dielectric layer 60 has the same material as that of the first dielectric layer 30.

Then, a plurality of holes are formed in the second dielectric layer 60 by laser drilling, and a plurality of second conductive 70 vias are correspondingly formed in the plurality of holes by copper plating. As shown in FIG. 7, some of the second conductive vias 70 are electrically connected with the first conductive vias 40 on the first semiconductor component 21, and some of the second conductive vias 70 are electrically connected with the first conductive vias 40 on the second part 12 of the leadframe 10.

Referring to FIG. 8, a second conductive film 80 is provided and formed on the second dielectric layer 60 by copper plating. In this embodiment, the second conductive film 80 substantially covers the second dielectric layer 60 and electrically connects with the second conductive 70 vias (FIG. 7) in the second dielectric layer 60.

After the second conductive film 80 formed on the second dielectric layer 60, the fabrication of the embedded packaging device 1 according to an embodiment of the invention is completed.

Note that the fabrication method of the embedded packaging device 1 is not restricted. In some embodiments, the first conductive vias 40 and the second conductive vias 70 may also be formed by one-time laser drilling and copper plating after the second dielectric layer 60 is formed on the first dielectric layer 30.

As mentioned above, the invention provides an embedded packaging device which successfully integrates at least two electronic components, each with a different thickness. In particular, the embedded packaging device includes at least one III-V compound semiconductor and can be applied to a power related product, such as a transformer or power supply. With the aforementioned structural features, the heat dissipation ability of the embedded packaging device can also be effectively improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An embedded packaging device, comprising:
a leadframe;
a first semiconductor component, disposed on the leadframe;
a second semiconductor component, disposed on the leadframe, and electrically connected with the first semiconductor component;
a passive component, disposed on the leadframe, and electrically connected with the first semiconductor component and the second semiconductor component;
a first dielectric layer, formed on the leadframe, and covering the first semiconductor component, the second semiconductor component, and the passive component;
a plurality of first conductive vias, formed in the first dielectric layer; and a first conductive film, formed on the first dielectric layer, and electrically leadframe through the plurality of first conductive vias;
wherein at least one of the first semiconductor component and the second semiconductor component is flip-chip mounted on the leadframe;
wherein the first semiconductor component is a High-Voltage (HV) switch having a first source pad, a first drain pad, and a first gate pad, and wherein the second semiconductor component is a Low-Voltage (LV) switch having a second source pad, a second drain pad, and a second gate pad.

2. The embedded packaging device as claimed in claim 1, further comprising:
a second dielectric layer, formed on the first dielectric layer, and covering the first conductive film;
a plurality of second conductive vias, formed in the second dielectric layer, and electrically connected with a part of the plurality of first conductive vias; and
a second conductive film, formed on the second dielectric layer, and electrically connected with the first semiconductor component through the plurality of second conductive vias and the part of the plurality of first conductive vias.

3. The embedded packaging device as claimed in claim 1, wherein the HV switch includes a plurality of HV transistors connected in parallel, and each of the HV transistors has a first source electrode electrically connected with the first source pad, a first drain electrode electrically connected with the first drain pad, and a first gate electrode electrically connected with the first gate pad, and wherein the LV switch includes a plurality of LV transistors connected in parallel, and each of the LV transistors has a second source electrode electrically connected with the second source pad, a second drain electrode electrically connected with the second drain pad, and a second gate electrode electrically connected with the second gate pad.

4. The embedded packaging device as claimed in claim 3 wherein the HV switch is a lateral type component, and the HV transistors comprise nitride-based High Electron Mobility Transistors (HEMTs).

5. The embedded packaging device as claimed in claim 3, wherein the LV switch is a vertical type component having a first surface and a second surface opposite to the first surface, wherein the second drain pad is disposed on the second surface adjacent to the leadframe, and the second source pad and the second gate pad are disposed on the first surface.

6. The embedded packaging device as claimed in claim 1, wherein the leadframe includes a first part, a second part, a third part, and a fourth part, wherein the first part of the leadframe is electrically connected with the first drain pad, the second part of the leadframe is electrically connected with the first gate pad and the second source pad, the third part of the leadframe is electrically connected with the first source pad and the second drain pad, and the fourth part of the leadframe is electrically connected with the second gate pad.

7. The embedded packaging device as claimed in claim 6, wherein the first conductive film includes a first part and a second part, wherein the first part of the first conductive film is electrically connected with the second gate pad, and the second part of the first conductive film is electrically connected with the second source pad.

8. The embedded packaging device as claimed in claim 7, wherein the first conductive film further includes a third part, and the third part of the first conductive film is electrically connected with the second source pad.

9. The embedded packaging device as claimed in claim 1, wherein the passive component has a first terminal and a second terminal, wherein the first terminal is electrically connected with the second drain pad and the first source pad, and the second terminal is electrically connected with the second source pad and the first gate pad.

10. The embedded packaging device as claimed in claim 1, wherein the first source pad and the second drain pad are electrically connected through the leadframe, and the first gate pad and the second source pad are electrically connected through the leadframe and the plurality of first vias.

11. The embedded packaging device as claimed in claim 1, further comprising a driving IC, disposed on the leadframe and electrically connected with the second gate pad.

12. The embedded packaging device as claimed in claim 1, wherein the leadframe forming a counterbore and the first semiconductor component or the second semiconductor component is disposed in the counterbore of the leadframe.

13. An embedded packaging device, comprising:
a leadframe, including a first part, a second part, a third part, and a fourth part;
an HV switch, disposed on the leadframe, and having a first drain pad electrically connected with the first part of the leadframe, a first gate pad electrically connected with the second part of the leadframe, and a first source pad electrically connected with the third part of the leadframe;
an LV switch, disposed on the leadframe, and having a second drain pad electrically connected with the third part of the leadframe, a second gate pad electrically connected with the fourth part of the leadframe, and a second source pad electrically connected with the second part of the leadframe;
a passive component, disposed on the leadframe, and having a first terminal electrically connected with the second part of the leadframe and a second terminal electrically connected with the third part of the leadframe;
a first dielectric layer, formed on the leadframe, and covering the HV switch, the LV switch, and the passive component;
a plurality of first conductive vias, formed in the first dielectric layer, and
a first conductive film, formed on the first dielectric layer, and electrically connected with the LV switch and the leadframe through the plurality of first conductive vias.

14. The embedded packaging device as claimed in claim 13, wherein the HV switch includes a plurality of Depletion mode (D-mode) transistors electrically connected in parallel, and each of the D-mode transistors is a lateral type nitride-based transistor.

15. The embedded packaging device as claimed in claim 13, wherein the LV switch includes a plurality of Enhancement mode (E-mode) transistors electrically connected in parallel, and each of the E-mode transistors is a vertical type silicon-based transistor.

16. The embedded packaging device as claimed in claim 13, wherein the first conductive film includes a first part and a second part, wherein the first part of the first conductive film is electrically connected with the second gate pad, and the second part of the first conductive film is electrically connected with the second source pad and the first gate pad.

17. The embedded packaging device as claimed in claim 16, wherein at least one of the first conductive vias is electrically connected between the first part of the first conductive film and the second gate pad, at least another one of the first conductive vias is electrically connected between the second part of the first conductive film and the second source pad, and at least yet another one of the first conductive vias is electrically connected between the second part of the first conductive film and the first gate pad.

18. The embedded packaging device as claimed in claim 16, wherein the first conductive film further includes a third part, and the third part of the first conductive film is electrically connected with the second source pad.

19. The embedded packaging device as claimed in claim 18, wherein the leadframe further includes a fifth part, and the fifth part of the leadframe is electrically connected with the third part of the first conductive film.

* * * * *